United States Patent Office 3,702,766

Patented Nov. 14, 1972

3,702,766
PHOTORESIST COMPOSITIONS CONTAINING N-HALO CYCLIC IMIDES

Kenneth R. Dunham, Richard A. Newcomb, and Marshall E. Yost, Rochester, N.Y., assignors to Eastman Kodak Company, Rochester, N.Y.

No Drawing. Continuation-in-part of applications Ser. No. 55,973 and Ser. No. 55,974, both July 17, 1970. This application Jan. 29, 1971, Ser. No. 111,121
Int. Cl. G03c *1/70, 1/68*
U.S. Cl. 96—75 25 Claims

ABSTRACT OF THE DISCLOSURE

Novel photoresist compositions are described which have improved adhesion to the substrate on which they are coated.

This application is a continuation-in-part of our copending U.S. applications Ser. Nos. 55,973 and 55,974 both filed July 17, 1970, now abandoned.

This invention relates to photoresists. In a particular aspect it relates to photoresist compositions having improved adhesion to the substrate on which they are carried and to elements bearing layers of such photoresist compositions.

It is well known to employe light sensitive polymers and polymer compositions in the preparation of photoresists on surfaces which are to be treated with etchants or other active solutions such as acids, plating baths, and the like. The developed resist protects the coated surfaces from the action of the active solution, which acts on the unprotected areas of the substrate. Most applicants in which photoresists are used require good adhesion of the photoresist material to the support on which it is coated. Good adhesion of the photoresist to the substrate becomes more significant as the activity of the etchant increases and as the size of the image decreases. In the case of microelectronic circuit preparation, for example, where relatively small images are reproduced, adhesion of the photoresist is critical in maintaining the desired high resolution and image quality. Since photoresist compositions based on light sensitive polymers and light sensitive polymer compositions have found wide acceptance for the preparation of microelectronic circuits, there has arisen increased interest in methods of improving the adhesion of such photoresist compositions to substrates in general, and, in particular to substrates which are employed in microelectronic work, such as silicon wafers.

A number of methods have been suggested to improve the adhesion of photoresist coatings to metals, metal oxides, and other surfaces on which photoresists are typically prepared. Precoating surface treatments, which will activate or clean the surface in a particular way, have been used to improve the bond formed between the surface and the coating. Such methods are generally designed for the particular surface involved and are not of general applicability. Any treatment to modify the surface before coating with a photoresist layer necessarily involves an extra step in the procedure, which is costly in both time and money. Then, too, some of the surface treatments may involve the use of toxic chemicals or require operation at elevated temperatures which either are hazardous or increase the costs of preparation.

Thus, there is a need for a simple and economic means for improving the degree of adhesion of photoresist compositions to substrates on which they are coated, and in particular to those substrates which require the use of extremely active etchants or on which relatively small resist images are generally formed, such as those substrates generally employed in the preparation of microelectronic circuits.

Accordingly, it is an object of this invention to provide novel photoresist compositions.

It is a further object of this invention to provide novel photoresist compositions having improved adhesion to a variety of substrates.

It is still a further object of this invention to provide improved photoresist compositions which will permit etching with extremely active etchants using relatively small resist images without premature failure of the resist image.

It is still another object of this invention to provide novel photosensitive elements in which the photoresist composition has improved adhesion to the substrate on which it is carried.

The above and other objects of this invention will become apparent to those skilled in the art from the further description of the invention which follows.

In accordance with the present invention we have found that an improvement in adhesion between the photoresist composition and the substrate can be obtained by adding polar N-substituted imides to known photoresist compositions and that a further improvement in adhesion can be obtained by incorporating certain organo silanes in the photoresist composition to which the N-substituted imide has been added. The photoresist compositions with which the present invention is particularly effective are those based on sensitized rubbery and rubber-like materials, such as azide sensitized rubbery materials, or those which are based on light sensitive polymers such as unsaturated acid esters of hydroxyl containing polymers like polyvinyl cinnamate and similar materials.

The polar N-substituted imides which are most useful in the present invention are N-halo cyclic imides such as N-bromosuccinimide, N-chlorosuccinimide, N-iodosuccinimide, N-bromoglutarimide, N-chloroglutarimide, N-iodoglutarimide, N-bromophthalimide, N-chlorophthalimide, N-iodophthalimide, and the like. The preferred N-halo cyclic imides which are used with the coating compositions of the present invention can be represented by the structural formula

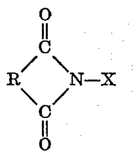

wherein X is a halogen atom such as a chlorine atom, a bromine atom or an iodide atom, and R is an alkylene group of 2 to 8 carbon atoms such as ethylene, propylene, hexylene, octylene, etc., or an arylene group such as an o-phenylene group, including alkylene and arylene groups substituted with such groups as alkoxy groups, aryloxy groups, halo groups, nitro groups, and the like.

The organo silanes which are useful in conjunction with the photosensitive coating compositions of the present invention are organoalkoxy silanes free of halogen, epoxy and amino groups. Preferably they contain at least two and no more than three alkoxy groups, the alkoxy groups preferably containing 1 to 4 carbon atoms, i.e., they are methoxy, ethoxy, propoxy or butoxy groups. The remaining substituents on the silane are organo-functional groups, other than epoxy groups or amino groups. Such other groups can be, for example, alkyl groups of 1 to 18 carbon atoms, e.g., methyl, ethyl, propyl, butyl, hexyl, octyl, dodecyl, stearyl, etc., aralkyl groups such as benzyl groups, alkoxyalkyl groups of 1 to 12 carbon atoms, e.g. methoxyethyl, ethoxyethyl, methoxypropyl, etc. alkenyl groups such as a vinyl group, acyloxyalkyl group wherein the acyl function is an alkylcarbonyl or akenylcarbonyl group, e.g. acetoxyethyl, acryloxypropyl, methacryloxypropyl, etc. aryl groups such as a phenyl group, alkaryl groups such as toluyl groups, and the like organofunctional substituents.

Representative organoalkoxysilanes which are useful in the practice of the present invention include such silanes as methacryloxypropyltrimethoxysilane, phenyltrimethoxysilane, benzyltrimethoxysilane, dimethyldimethoxysilane, methylphenyldimethoxysilane, diphenyldimethoxysilane, vinyltrimethoxysilane, hexyltrimethoxysilane, stearyltrimethoxysilane, diphenyldiethoxysilane, dimethyldiethoxysilane, methyltoluyldiethoxysilane, methylphenyldipropoxysilane, and phenyltripropoxysilane.

It has been found, however, that not all organoalkoxysilanes are effective to improve adhesion of the photoresist coating to the substrate on which it is carried. In fact, some organoalkoxysilanes have an adverse effect on adhesion of the photoresist to the substrate, or the light sensitivity of the photoresist or both. In particular, it has been found that organoalkoxysilanes containing halogen atoms, epoxy groups or amino groups adversely effect the adhesion or light sensitivity of the photoresist group, and hence, the organoalkoxysilanes employed with the coating composition of the present invention should be free of such groups.

When the polar N-halo cyclic imides of the present invention are added to known photoresist compositions, either alone or together with the organoalkoxysilanes, there is obtained an increase in adhesion to the substrate in comparison to the unmodified photoresist composition. This is obtained not only with the substrates of the type generally employed with resists, such as copper, zinc, steel, chromium, and the like, but a particular improvement in adhesion is obtained with substrates of such materials as silicon dioxide where adhesion has been a problem in the art and which are employed in microelectronics work where high resolutions of detailed images is required.

The amount of N-substituted imide added to the photoresist composition can vary widely. Useful results are obtained when the polar N-substituted imide is added to the photoresist composition in amounts of up to about 10 percent by weight based on the weight of the polymer present in the composition. This can constitute up to about 2.5 percent by weight of the coating composition. Preferably the polar N-halo cyclic imide is added to the photoresist composition in amount of about 0.5 to 3 percent by weight of the polymer.

Extremely good results are obtained when the organoalkoxysilane are employed in the photoresist composition in amount of about 0.5 to 3 percent by weight of the polymer.

Extremely good results are obtained when the organoalkoxysilane are employed in the photoresist compositions in amounts up to about 5 percent by weight based on the weight of polymeric material in the coating composition, without having deleterious effect on other properties of the photoresist coating. Preferably, the organoalkoxysilanes is added to the coating composition in amount of about 0.5 to 2 percent by weight, based on the weight of the polymeric material; typically this would correspond to an amount of about 0.025 to 0.5 percent by weight based on the weight of the total coating composition.

Photosensitive elements are prepared by incorporating an N-substituted imide, and optionally an organoalkoxysilane, into a light sensitive polymeric composition and coating the composition onto a support by conventional coating techniques such whirlcoating, flow coating, dip coating, spray coating, etc. In general, the selection of a light sensitive polymer composition, the solvent for its application, the support material to which it is applied, and the method of coating on the support depends upon the intended use of the resist image produced. As indicated above, the coating compositions of the present invention can be used with all of the supports on which resist coatings are generally made. This includes such supports as sheets and foils of such metals as copper, aluminum, steel, zinc, magnesium, etc., silicon dioxide chips and wafers, glass, glass coated with such metals as chromium, chromium alloys, nickel, steel, silver, gold, platinum, etc., and the like. When the photoresist composition contains an organoalkoxysilane, there should be sufficient water on the surface of the support to hydrolyze the alkoxy groups on the silane. This can be the water of hydration which is present on the surface of the support even after the heating step which is customary employed to drive off loosely bound water.

The choice of the polymeric photosensitive composition depends upon the photographic speed required, and the properties desired in the final resist image. A wide variety of photosensitive polymeric compositions useful for making relief or stencil like resist images can be employed.

One type of photosensitive composition comprises a polymer or resin which itself is not light sensitive but to which is added a sensitizer which makes the composition photosensitive by imparting to it the property of becomng insolubilized on exposure to visible or ultraviolet radiation. Such compositions can be based on naturally occurring materials such as shellacs, gelatin, glue, and similar materials or synthetic materials such as polyvinyl alcohol, polyethylene, nylon, and the like. Photosensitive compositions based on such materials are generally sensitized with bichromates.

Preferred compositions of this type, with which it is particularly advantageous to utilize the present invention, are based on natural or synthetic rubbery materials which are sensitized with organic solvent soluble azides. Suitable rubbery materials include natural rubber, which is commonly known as sulfur vulcanizable rubber, oxidized rubbers, such as are described in Stevens et al. U.S. Pat. 2,132,809, cyclized rubbers such as are described in Carson U.S. Pat. 2,371,736 and Osterhof U.S. Pat. 2,381,180, rubbery synthetic polymers and copolymers such as those prepared from 1,3-diolefins, e.g., 1,3-butadiene, isoprene, neoprene, etc. cyclized polyisoprene prepared, for example, as described in Journal of Polymer Science, part A, vol. 2, No. 9, pp. 3969–85 and 3987–4001 (1964), and copolymers of butadiene with various unsaturated comcompounds such as styrene, isobutylene, etc. Such synthetic copolymers are known commercially under tradenames such as Buna S, Buna N, Butyl, Pliolite, and the like.

The organic solvent soluble azide sensitizers are arylazides and preferably are bisazides such as 4,4′-diazidostilbene, p-phenylene-bisazide, 4,4′-diazidobenzophenone, 4,4′-diazidodiphenylmethane, 4,4′-diazidochalcone, 2,6-di-(4′-azidobenzal)cyclohexanone, 2,6-di-(4′-azidobenzal)-4-methyl cyclohexanone, and the like, although monoazides, such as p-azidobenzophenone, can be successfully employed.

Representative photosensitive compositions with which the present invention is useful and which employ such organic solvent soluble colloids and azides are described in such patents as Hepher et al. U.S. U.S. Pat. 2,852,379, Sagura et al. U.S. Pat 2,940,853, Kodak British Pat. 886,100, and Kodak British Pat. 892,811.

Another group of photosensitive compositions with which the present invention is useful are based on polymers which contain unsaturated groupings and which are inherently light sensitive. Such compositions, however, can contain sensitizers to increase their speed or modify their spectral response. A preferred group of such polymers are obtained by esterification of hydroxy-containing polymeric materials, such as polyvinyl alcohol, cellulose, and the like, with a cinnamic acid halide, such as cinnamic acid chlorides or m-nitro cinnamic acid chlorides and the like, as described in U.S. Pat. 2,670,286. Cinnamic acid esters of polyvinyl alcohol and cellulose of varying acyl content may be prepared by deacylation of substantially fully esterified cinnamic acid esters as described in U.S. Pat. 2,725,372. Particularly useful are the solvent-soluble esters containing from about 60 to 100 mole percent, preferably about 87 to 100 mole percent, of vinyl cinnamate.

By the term "cinnamic acid esters of polyvinyl alcohol and cellulose" is meant organic solvent-soluble esters containing from about 60 to 100 mole percent of combined cinnamoyl ester groups. This includes simple as well as mixed esters, e.g. polyvinyl acetate cinnamates and cellulose acetate cinnamates containing at least 60 mole percent cinnamoyl ester and the balance comprising a different acyl group or being unesterified or both.

The amount of polymer and sensitizer compound in the resist coating composition depends somewhat upon the solubility in the particular solvent used, the compatibility of the sensitizer with the photosensitive polymeric material, and, of course, the intended use of the composition. Generally, useful results are obtained with compositions containing up to about 25 percent polymer by weight, and preferably about 5 to 15 percent polymer by weight. The sensitizer can comprise about 2 to 25 percent by weight based on the weight of the polymer. Preferably the sensitizer is employed in amount of about 2 to 10 percent by weight of the polymer. Of course, for particular application proportions outside these ranges may be desired.

The coating compositions can additionally contain other addenda known in the art and employed for their known purpose such as surfactants, coating aids, antioxidants, fungicide, bactericides, thickeners, and the like. Certain of these addenda, such as certain antioxidants, have a tendency to react preferentially with certain of the silanes, in which case the addendum is added to the photoresist composition last.

Photoresist images are prepared with the photosensitive compositions of this invention by first treating the support in accordance with usual practices, such as preparatory treatment of the surface with acids, cleaning agents, and the like to clean the surface and insure good adhesion of the resist thereto. With such treatments and with certain supports, the surface can be heated for a period of time sufficient to drive off any residual water or other liquid remaining from the cleaning operation. Next, the photoresist composition is coated on the support in accordance with conventional techniques referred to above. The coating thickness will depend upon the particular resist composition being employed, and the intended use of the resulting resist. Thickness in the range of 0.1 to 1 mils are suitable for most photoresist uses. The coated photosensitive element is prebaked at a temperature in the range of 60 to 130° C. for a period of time sufficient to remove the residual solvent. This prebaking also improves adhesion of the coating to the support to a certain extent and prevents removal of exposed areas of the coating during development. A photoresist image is prepared with the photosensitive element by imagewise exposing the element to a suitable souce of actinic radiation to harden and insolubilize the composition in exposed areas. The image can then be developed by washing with a solvent for the unexposed unhardened material which is a nonsolvent for material is exposed areas to preferentially remove the polymer composition from the unexposed areas and leave a relief image of hardened polymer in the exposed areas. After the relief image is developed, adhesion of the resist to the support is improved by postbaking the element for from about 5 to 15 minutes at a temperature in the range of about 120 to 180° C. The polymeric relief pattern is then ready for use as a resist in accordance with conventional techniques known to those skilled in the art.

The following examples further illustrate the practice of the present invention.

EXAMPLE 1

A photoresist composition based on cyclized polyisoprene is prepared having the following compositions:

| | | |
|---|---|---|
| Cyclized polyisoprene | grams | 45 |
| Xylene | milliliter | 255 |
| 2,6 - di - (4' - azidobenzal)-4-methyl cyclohexanone sensitizer | grams | 1.5 |

This photoresist solution is divided into three 100 milliliter portions. One portion is left as is and used as a control; to the second portion is added 0.18 gram of N-bromosuccinimide; and to the third portion is added 0.37 gram of N-bromosuccinimide. These three photoresist compositions are then coated on sheets of stainless steel and dried to give coatings having a dry thickness of 0.25 mil. The three light sensitive elements thus obtained are then exposed through a negative transparency for four minutes to 200 foot-candles from a carbon arc source. Images are developed by washing out the unexposed areas of the resist coatings with Stoddard's solvent, rinsing the elements with water and then postbraking them at 140° C. for 15 minutes. The stainless steel substrates are then etched by immersing the elements in an etchant solution having the following composition:

| | Ml. |
|---|---|
| 37–38% hydrochloric acid | 200 |
| 70–71% nitric acid | 175 |
| 42° Bé ferric chloride | 2625 |

The elements are allowed to remain in the etchant until failure of the resist occurs. To determine whether or not there has been failure of the resist, the elements are removed periodically from the etchant, rinsed with water, and subjected to a stream of high pressure (15 p.s.i.) air. The jet of air dries the element, and in cases of failure, the resist layer is removed by the force of the air striking the surface. If no failure occurs, the element is returned to the etchant for an additional period, and the determination is repeated until failure occurs. With the control element, failure occurs after ½ hour; with the elements coated with the resist compositions to which N-bromosuccinimide has been added failure of the resist does not occur until after 1 hour has elapsed.

EXAMPLE 2

A photoresist composition based on a light sensitive polymer is prepared having the following formulation:

| | | |
|---|---|---|
| Polyvinylcinnamate | grams | 12.5 |
| 1,2-benzanthraquinone | do | 1.25 |
| Hydroquinone | do | 0.1 |
| Benzoic acid | do | 0.5 |
| Xylene | milliliters | 375 |
| Methylglycol acetate | do | 125 |

This composition is divided into two 250 milliliter portions. One portion is not modified and used as a control, while to the second portion is added 0.3 gram of N-bromophthalimide. The two photoresist compositions are then whirl coated on copper supports and dried to give a dry coating thickness of 0.3 mil. The light sensitive element is then exposed to a 35 amp. white flame carbon arc source through a negative transparency at a distance of 4 feet for about 1 minute. A resist image is developed by removing unexposed polymer from the element by washing in benzene with gentle agitation. The substrate is then etched by immersing the element in a 42° Bé ferric chloride etchant solution at 130° F. After the resist image on the element prepared from the control composition fails, there is still good adhesion between the copper substrate and the resist image prepared from the composition to which the N-bromophthalimide has been added.

EXAMPLE 3

Example 1 is repeated substituting for the stainless steel support a silicon wafer. Similar results are obtained.

EXAMPLE 4

Example 1 is repeated substituting N-chlorosuccinimide for the N-bromosuccinimide. Similar results are obtained.

EXAMPLE 5

Example 1 is repeated substituting N-iodoglutarimide for the N-bromosuccinimide. Similar results are obtained.

EXAMPLE 6

This example illustrates that the presence of both silane and N-bromosuccinimide markedly improves the adhesion of rubbery photoresist coatings to stainless steel.

A coating composition is prepared comprising:

| | Parts |
|---|---|
| Cyclized polyisoprene | 15 |
| Xylene | 100 |
| 2,6 - di - (4′ - azidobenzal) - 4 - methyl cyclohexanone sensitizer | 0.53 |

The solution is coated on a stainless steel plate and dried. After exposure to a fine image pattern and development in Stoddard's solvent the resist is heated for 15 minutes at 150° C. It is then etched in the etch bath for Example 1. The resist fails after ½ hour.

A similar composition to which 0.1 part of γ-methacryloxypropyl-trimethoxy silane has been added, is used to prepare a resist, as described above, which withstands the action of the etch bath for 1½ hours. A similar composition to which is added 0.5 part of N-bromosuccinimide in addition to the silane is used to prepare a resist, as described above, which withstands the action of the etch bath for 3 hours.

The above invention has been described in detail with particular reference to preferred embodiments thereof, but it will be understood that variations and modifications can be effective within the spirit and scope of the invention.

What is claimed is:

1. A photosensitive polymeric coating composition comprising (1) an organic solvent-soluble, light-sensitive, film-forming polymeric material selected from the group consisting of (a) arylazide sensitized rubbery materials, and (b) cinnamic acid esters of hydroxy containing polymers, and (2) a polar N-halo cyclic imide.

2. A composition as defined in claim 1, wherein the N-halo cyclic imide has the structural formula

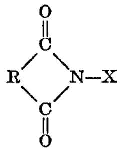

wherein X is a halogen atom and R is an alkylene group of 1 to 8 carbon atoms or an arylene group.

3. A composition as defined in claim 2, wherein the N-halo cyclic imide is selected from the group consisting of N-bromosuccinimide, N-iodoglutarimide, and N-bromophthalimide.

4. A composition as defined in claim 1, wherein the N-halo cyclic imide comprises up to 10 percent by the weight of the composition based on the weight of the polymeric material.

5. A composition as defined by claim 1 further comprising an organoalkoxysilane free of halogen, epoxy and amino groups.

6. A composition as defined in claim 5 wherein the organo alkoxysilane comprises 0.025 to a 5 percent by weight of the coating composition.

7. A composition as defined in claim 5 wherein the organoalkoxy silane contains two to three alkoxy groups of 1 to 4 carbon atoms and the remaining silane substituents are selected from the group consisting of alkyl groups, alkenyl groups, acyloxyalkyl groups and aryl groups.

8. A composition as defined in claim 7 wherein the organo-silane is γ-methacryloxypropyltrimethoxy silane.

9. A composition as defined in claim 1 wherein the light-sensitive, film-forming polymeric material is a polyvinyl cinnamate.

10. A composition as defined in claim 1 wherein the light-sensitive, film-forming polymeric material is an arylazide-sensitized rubbery material.

11. A composition as defined in claim 10 wherein the arylazide-sensitized rubbery material is an arylazide-sensitized natural rubber.

12. A composition as defined in claim 10 wherein the arylazide-sensitized rubbery material is an arylazide- sensitized synthetic rubber.

13. A composition as defined in claim 10 wherein the arylazide-sensitized rubbery material is an arylazide-sensitized cyclized polyisoprene.

14. A composition as defined in claim 10 wherein the arylazide-sensitized rubbery material is an arylazide-sensitized styrene-isoprene copolymer.

15. A photosensitive polymeric coating composition comprising a solution in an organic solvent of (1) an organic solvent-soluble, film-forming, cyclized polyisoprene sensitized with an organic solvent soluble bisarylazide, and (2) an N-halo cyclic imide selected from the group consisting of N-bromosuccinimide, N-iodoglutarimide, and N-bromophthalimide, the N-halo cyclic imide constituting about 0.5 to 3 percent by weight of the cyclized polyisoprene.

16. A photosensitive polymeric coating composition as defined in claim 15 further comprising an organoalkoxysilane containing two to three alkoxy groups of 1 to 4 carbon atoms and the remaining silane substituents are acyloxyalkyl groups, the organo alkoxysilane comprising about 0.025 and 0.5 percent by weight of the coating composition.

17. A photosensitive polymeric coating composition comprising an organic solvent-soluble cyclized rubbery material sensitized with an organic solvent-soluble bisarylazide, and about 0.5 to 3 percent by weight, based on the weight of the cyclized rubber, of N-bromosuccinimide.

18. A photosensitive polymeric coating composition as defined in claim 17 further comprising about 0.5 to 2 percent by weight, based on the weight of cyclized rubber, of γ-methacryloxypropyltrimethyloxysilane.

19. A photosensitive element comprising a support bearing a layer of a photosensitive polymeric coating composition comprising (1) an organic solvent-soluble, light-sensitive, film-forming polymeric material selected from the group consisting of (a) arylazide sensitized rubbery materials, and (b) cinnamic acid esters of hydroxy containing polymers, and (2) a polar N-halo cyclic imide.

20. A photosensitive element as defined in claim 19 wherein the N-halo cyclic imide is selected from the group consisting of N-bromosuccinimide, N-iodoglutarimide and N-bromophthalmide.

21. A photosensitive element as defined in claim 19 further comprising an organoalkoxysilane free of halogen, epoxy and amino groups.

22. A photosensitive element as defined in claim 21 wherein the organoalkoxysilane contains two to three alkoxy groups, and the remaining silane substituents are organo-functional substitutents selected from the group consisting of alkyl groups, alkenyl groups, acyloxyalkyl groups, and aryl groups.

23. A photosensitive element as defined in claim 22 wherein the support is a metallic support.

24. A photosensitive element as defined in claim 22 wherein the support is a silicon support.

25. A photosensitive element as defined in claim 24 wherein the light sensitive polymeric material is an aryl azide-sensitized rubbery material.

References Cited

UNITED STATES PATENTS

| | | | |
|---|---|---|---|
| 3,495,987 | 2/1970 | Moore | 96—115 P |
| 3,042,515 | 7/1962 | Wainer | 96—115 R X |
| 3,520,683 | 7/1970 | Kerwin | 96—35.1 |
| 3,398,210 | 8/1968 | Plueddeman et al. | 260—827 |
| 3,405,017 | 10/1968 | Gee | 96—36.2 |
| 3,482,977 | 12/1969 | Baker | 96—36 |
| 3,549,368 | 12/1970 | Collins et al. | 96—36.2 |
| 2,852,379 | 9/1958 | Hepher et al. | 96—91 N |

RONALD H. SMITH, Primary Examiner

U.S. Cl. X.R.

96—86 P, 91 N, 115 R